United States Patent
Brumback et al.

(10) Patent No.: US 7,162,323 B2
(45) Date of Patent: Jan. 9, 2007

(54) DECENTRALIZED METHOD FOR MANUFACTURING HEARING AID DEVICES

(75) Inventors: Mark A. Brumback, Plano, TX (US); Dustin L. Potter, Sugar Land, TX (US)

(73) Assignee: Hearing Aid Express, Inc., Bellaire, TX (US)

( * ) Notice: Subject to any disclaimer, the term of this patent is extended or adjusted under 35 U.S.C. 154(b) by 74 days.

(21) Appl. No.: 10/959,282

(22) Filed: Oct. 6, 2004

(65) Prior Publication Data

US 2005/0222823 A1    Oct. 6, 2005

Related U.S. Application Data

(60) Provisional application No. 60/559,924, filed on Apr. 5, 2004.

(51) Int. Cl.
*G06F 19/00*    (2006.01)

(52) U.S. Cl. ............ 700/118; 700/163; 700/182; 345/420; 715/700; 703/13

(58) Field of Classification Search ............ 700/118, 700/163, 182; 345/420; 715/700; 703/13
See application file for complete search history.

(56) References Cited

U.S. PATENT DOCUMENTS

| | | | |
|---|---|---|---|
| 4,871,502 A | 10/1989 | LeBisch et al. | |
| 4,984,277 A | 1/1991 | Bisgaard et al. | |
| 5,006,055 A | 4/1991 | Lebisch et al. | |
| 5,008,058 A | 4/1991 | Henneberger et al. | |
| 5,056,204 A | 10/1991 | Bartschi | |
| 5,068,902 A | 11/1991 | Ward | |
| 5,121,329 A | 6/1992 | Crump | |
| 5,121,333 A | 6/1992 | Riley et al. | |
| 5,136,515 A | 8/1992 | Helinski | |
| 5,487,012 A * | 1/1996 | Topholm et al. ............ 700/163 |
| 5,641,448 A | 6/1997 | Yeung et al. | |
| 5,889,874 A | 3/1999 | Schmitt et al. | |
| 6,129,174 A | 10/2000 | Brown et al. | |
| 6,484,842 B1 | 11/2002 | Widmer et al. | |
| 6,533,062 B1 | 3/2003 | Widmer et al. | |
| 6,920,414 B1 * | 7/2005 | Topholm ............ 703/1 |
| 2002/0136421 A1 * | 9/2002 | Topholm ............ 381/314 |
| 2003/0074174 A1 * | 4/2003 | Fu et al. ............ 703/13 |
| 2003/0139658 A1 | 7/2003 | Collier et al. | |
| 2003/0152242 A1 | 8/2003 | Marxen et al. | |
| 2004/0107080 A1 * | 6/2004 | Deichmann et al. ............ 703/6 |

FOREIGN PATENT DOCUMENTS

| | | |
|---|---|---|
| BE | 09600370 | 3/1998 |
| CA | 2076682 | 2/1998 |
| EP | 0516808 B1 | 1/1996 |
| WO | WO 00/34739 | 6/1999 |
| WO | WO 01/05207 A2 | 1/2001 |
| WO | WO 01/87001 A2 | 11/2001 |
| WO | WO 02/25995 A1 | 3/2002 |

* cited by examiner

*Primary Examiner*—Leo Picard
*Assistant Examiner*—Douglas S. Lee
(74) *Attorney, Agent, or Firm*—Gary L. Bush, Esq.; Andrews Kurth LLP

(57) ABSTRACT

Method for manufacturing custom fit ear pieces, such as hearing aid devices, by using rapid prototyping machinery in a decentralized location to provide custom fit ear pieces to patients within a few hours rather than a few days or weeks.

21 Claims, 4 Drawing Sheets

DECENTRALIZED METHOD FOR MANUFACTURING HEARING AID DEVICES

CROSS REFERENCE TO RELATED APPLICATION

This application is based upon provisional application 60/559,924 filed on Apr. 5, 2004, the priority of which is claimed.

BACKGROUND OF THE INVENTION

1. Field of the Invention

This invention relates to the production of a custom fit hearing instrument, ear mold, or other ear devices. Other ear devices for this purpose of this specification include musician's custom ear monitors, swim plugs, and custom fit ear pieces for personal communication devices such as cell phones, PDAs, digital audio playback devices for music or portable audio/video equipment and custom fit language translators.

2. Description of the Prior Art

When custom hearing instruments, ear molds, and other ear devices are manufactured presently, an impression is made of the client's auditory canal and pinna, and then shipped to a manufacturing facility. After completion, the product is shipped back to the facility from which the order was placed, usually with a one to three week span of time between the time the client placed the order and the delivery of the product to the client. Similar delays occur in the event of repair, loss, irreparable damage or need for modification of the hearing instrument, ear mold, or other ear device.

This method of doing business is less than optimal for several reasons.

The process of shipping an ear impression of the individual to the manufacturing facility often results in an inaccurate fit of the ear device due to the impression material (which is usually silicone and always malleable) being shaken and handled roughly in transit to the manufacturing facility, resulting in an inaccurate impression of the client's ear at the point of manufacture.

The one to three week delay in the delivery of the product order to the client represents a loss of value, and is very inconvenient to the client.

The cost of shipping the product and all of the considerable costs associated with the operation of a manufacturing facility are passed on to the end user of the product, creating a high price to the consumer.

A delay of more than a few days for the repair of a hearing instrument, ear mold, or other ear device is not only very inconvenient to the client, but also poses potential psychological, social, and safety risks to the client.

The loss of a hearing instrument, ear mold, or other ear device requires another impression to be taken of the client's auditory canal and pinna, and a repeat of the delay of the initial manufacturing process.

The prior art method described above has used rapid prototyping techniques at a central manufacturing facility. The three dimensional shape of a user's ear canal can be obtained by either scanning an impression of the ear with a white light scanner or a laser or other three dimensional digitizing device, or by probing the ear with a type of three dimensional probe. The scanning data is input into a computer. Three dimensional design or modeling software mathematically models the impression into the shape of the desired instrument, ear mold, or other ear device. Next, the mathematical model at the central facility is used to produce an actual hearing aid shell or other device for client application. Even using the new Rapid Prototyping techniques, the delay in sending impression of the ear canal or a mathematical model thereof to a distant location and receiving an actual device back to the retail office takes one to three weeks.

Rapid Manufacturing, also known as Rapid Prototyping, encompasses many different technologies, all having in common the principle of additive or subtractive creation of tangible three dimensional parts from data provided either by computer model or direct duplication.

A more complete listing of these technologies is available in Terry Wohlers' *Wohlers Report* 2003, but the major methods are described briefly in the following paragraphs.

Selective Laser Sintering is based upon the principle of applying laser energy to a powerdous material in order to fuse the material at the point of contact with the laser. The laser traces a cross sectional slice of the object to be created, causing a cross sectional layer of the object desired to be created, and after completion of the first layer, more powderous material is placed atop the fused layers, and the next cross sectional layer is created in the same manner. The process is repeated until the fully developed part is formed.

Stereolithography is similar to Selective Laser Sintering, but rather than fusing powder to form objects, this process calls for the solidifying of a photosensitive resin with laser energy. The laser traces the outline of the object, creating a solidified cross section of a part of the object to be created. After the section is created, the layer is lowered into the resin, and the step is repeated. The process continues until the desired object is completed.

Fused Deposition Modeling and other similar processes such as the Thermojet Technique include the steps of depositing a cross sectional layer of thermoplastic or photosensitive plastic material, solidifying the layer by means of either temperature regulation or light exposure, and then laying then next layer upon the first. The process is repeated until the desired object is produced.

Laminated Object Manufacturing is the process of cutting sheets of plastic or paper, with a laser, cutting tool, or heat source, cross sectional layer by cross sectional layer, and fusing the sheets together at the point at which they are sliced to produce the desired object.

The Drop on Powder Method includes the steps of depositing a binding agent upon a powderous material, and binding it together to create a cross sectional layer of the object to be produced. An additional layer of the powderous material is then laid upon the first layer, and that layer is bound together. The process is repeated until the desired object is formed.

The Visible Light Masking Method is a preferred method of producing ear shells, and calls for projecting an image of a cross section of the object or objects to be created upon a photo sensitive resin or liquid photopolymer. The visible light cures the layer at the point of projection, and then the solidified layer is separated from the point of projection, allowing more photosensitive resin to fill in where the cured layer was previously. Next the light is projected again, solidifying the second layer. The process is repeated until the desired object is formed.

3. Identification of Objects of the Invention

A primary object of this invention is to provide a method for solving the problem of insufficient customer service and inadequate value as a result of prior art methods of centralized manufacture of hearing instruments, ear molds, and other ear devices.

Another object of the invention is to provide hearing aid devices to customers in a timely manner reducing delay of one to three weeks to a matter of one and one-half days or less.

SUMMARY OF THE INVENTION

The objects identified above are incorporated in the invention by eliminating the need to have the ear devices manufactured at a central location in a distant city. Instead, according to the invention, the devices are produced at the retail hearing aid dispensing office or close thereby or in the same metro area with Rapid Prototyping techniques and provided to the client within thirty-six hours, often in as little time as four hours.

BRIEF DESCRIPTION OF THE DRAWINGS

The invention is described in detail hereinafter on the basis of the embodiments represented schematically in the accompanying figure, in which.

DESCRIPTION OF A PREFERRED EMBODIMENT OF THE INVENTION

Prior Art Method of Manufacture of Hearing Aid Devices

Figure 1:
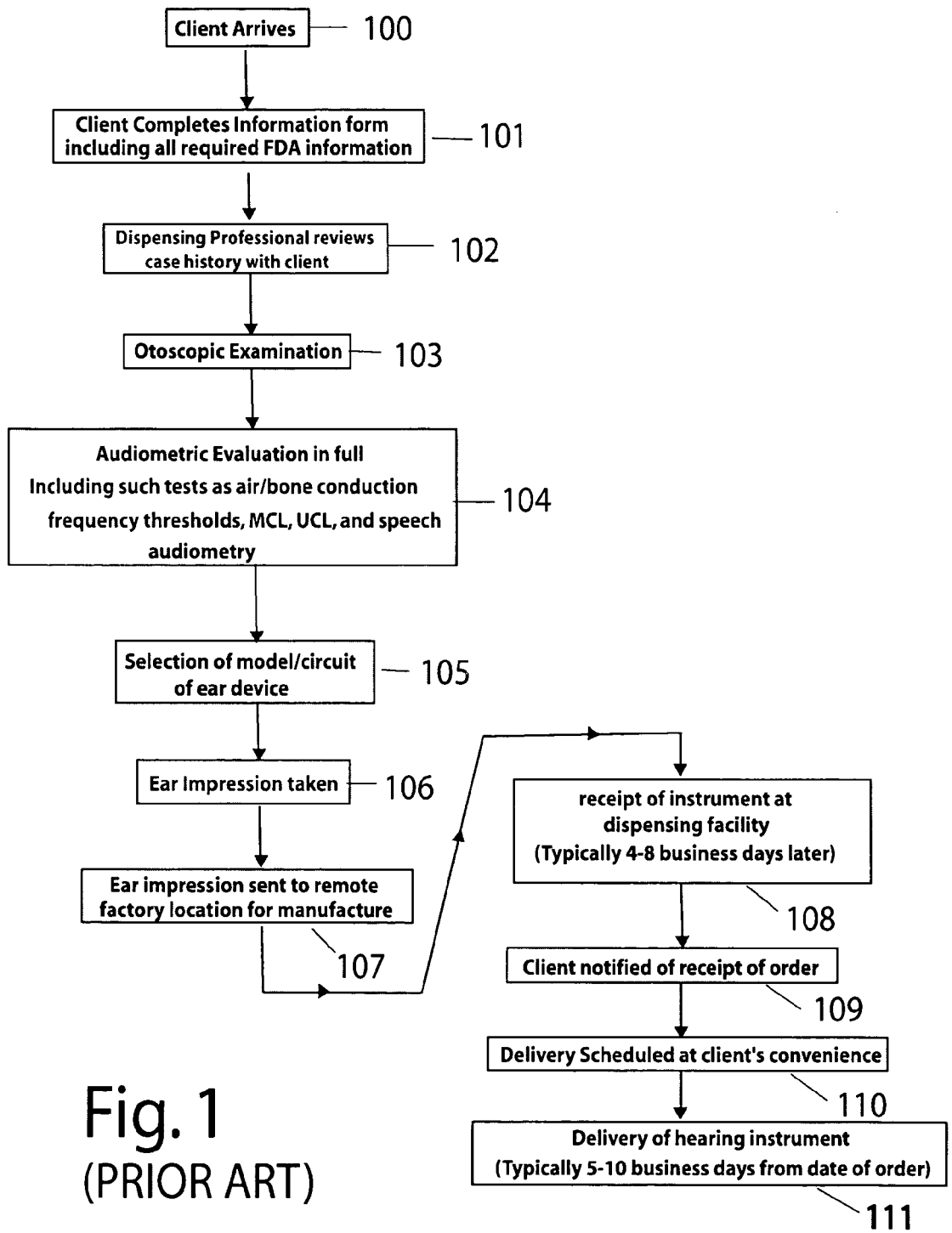
FIG. 1 is a block diagram that illustrates steps of a prior art method of producing hearing aids and other ear devices for a client where an ear impression is sent to a remote factory location for manufacture.

FIG. 1 is a flow chart of prior art steps taken to produce a hearing aid or other ear device in a business environment. After a client arrives, as shown in block 100, the client completes an information form including all required FDA information, as shown in logic block 101. Next, a dispensing professional reviews the patient's case history as shown in block 102 after which an otoscopic examination is conducted as shown in block 103. Next a full audiometric evaluation is conducted as in block 104 followed by the client selecting a model and circuit of an ear device as indicated in block 105. Next an ear impression is taken as shown in block 106. The ear impression is transferred, as indicated in block 107, to a factory location for manufacture of the instrument. Typically four to eight business days later, the manufactured instrument is received at the dispensing facility as indicated in block 108. The client is notified of receipt of the order as in block 109 and delivery is scheduled for the client's convenience as in block 110. The delivery of the hearing instrument is finally made to the client, as indicated by block 111 typically five to ten business days from the date of the order.

Manufacturing at Dispensing Office

Figure 2:
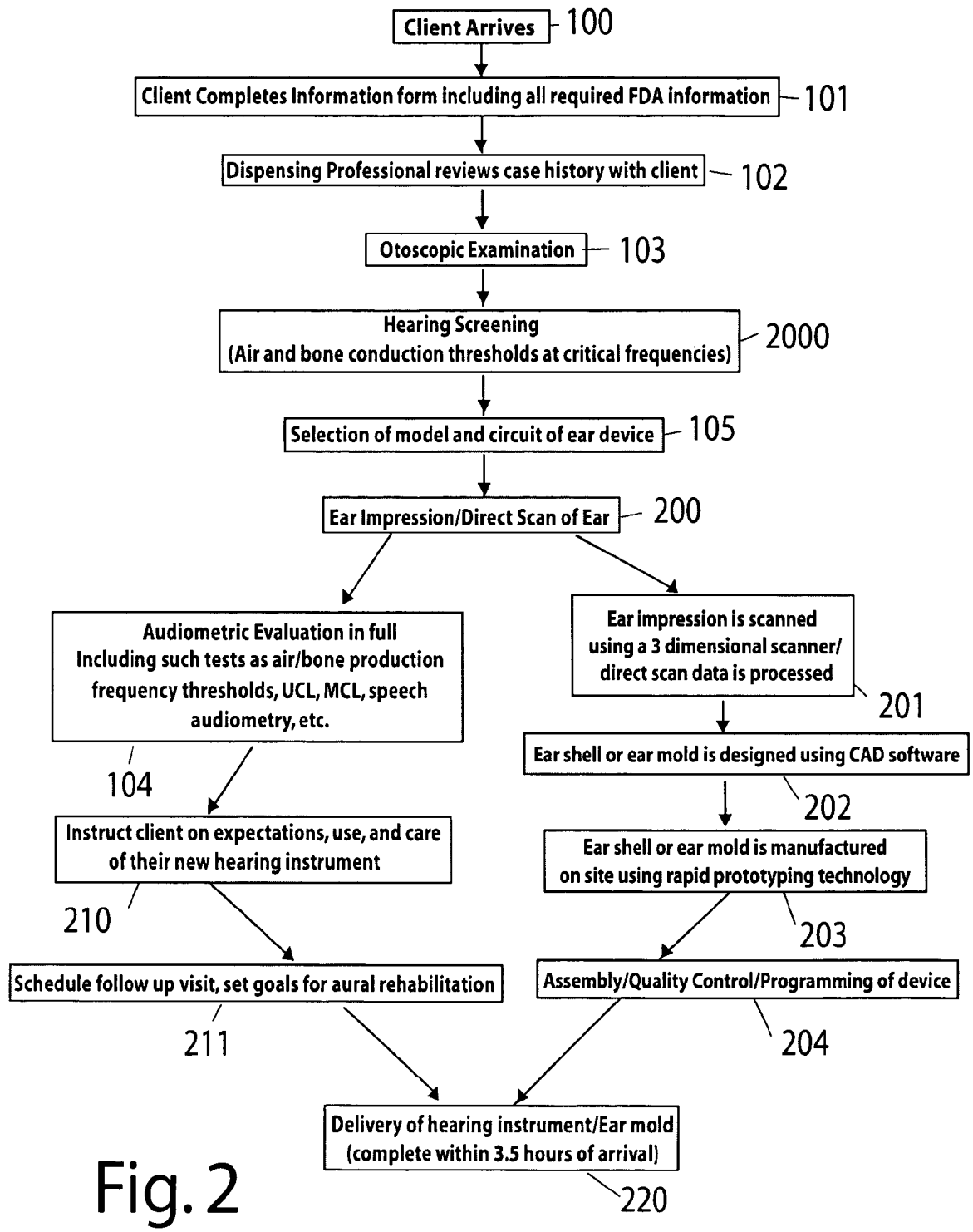
FIG. 2 is a block diagram that illustrates steps of a first method of producing hearing aids and other ear devices for a client according to the invention where an ear impression is scanned and a shell or ear mold is designed and manufactured by rapid prototyping at a retail location with delivery of a hearing instrument within three and one-half hours from client arrival at the retail location.

FIG. 2 is a flow chart of a process according to the invention where a hearing aid instrument is manufactured and dispensed at the same location, showing the steps to deliver to a client a hearing instrument within about three and one-half hours from the time that the client arrives at a dispensing location. The dispensing location may be a fixed building or it may be a mobile office in a van or a vehicle similar to a recreational vehicle. The steps 100 to 103 are the same described above with reference to FIG. 1. Next, a hearing screening test is performed as indicated in service block 200 where air and bone conduction thresholds are determined at critical frequencies. Such information is used later in step 204 for programming the client's frequency response circuit of the completed hearing aid device. After the client selects the model and circuit for the ear device as indicated in block 105, a decision is made as indicated in step 2000 as to whether information about the ear/ear canal is by taking a physical impression or obtaining a direct scan. Regardless of the method used, in block 201 a digital scan results either in the form of the client scan from block 2000 or by scanning the ear impression. In block 202, the digital scan information is used by CAD software to create a mathematical ear shell or ear mold. Such model is used in block 203 to create a physical ear shell or ear mold at the dispensing office by using one of the rapid prototyping methods described above, preferably the Visible Light Masking Method. A preferred machine based on that method is manufactured by Envisiontec, GmbH of Switzerland. Next, as illustrated in service block 204, a circuit is assembled into the shell or ear mold and the hearing aid device is inspected for quality control and programmed for the client based on information obtained in steps 2000 and 104 as described below.

The method in FIG. 2 is advantageous, because while the scanning/processing steps and design steps of blocks 201 and 202 are being done, the full audiometric evaluation of steps 104 can also be conducted. In other words, those functions depicted in blocks 104 and in 201, 202, 203 can be done parallel in time rather than sequentially in time. The client is instructed as to expectations, use and care of the hearing aid as illustrated in block 210 and a discussion as to a follow-up visit and goals for aural rehabilitation are described as indicated by block 211. The delivery of the hearing instrument or ear mold is made to the client within three and one-half hours as indicated in service block 220.

As can be seen, because scanning of the ear or ear canal, CAD design and manufacture on site using rapid prototyping technology all occurs on the premises (or close thereto) of the ear dispensing offices, the delivery time for the hearing instrument/ear mold is substantially reduced. As indicated in FIG. 1, the prior art method of dispensing a hearing instrument takes from five to ten business days from the date of order. According to the embodiment of the invention depicted in FIG. 2, the hearing instrument or ear mold can be delivered within three and one-half hours from the time of arrival that a client enters a dispensing location. Such great reduction in time from the prior art five to ten business days is achieved because (1) the mold or ear shell can be manufactured in the offices (or close thereto) of the dispensing location obviating the need to send an ear impression to a distant central manufacturing location such that time is saved due to eliminating paper work and handling at a central manufacturing location plus the time required to ship the impression to the central factory and the time required to ship the ear shell or ear mold back from the central factory to the dispensing location and (2) the manufacturing steps of scanning, designing and manufacturing can proceed in parallel with a client's full audiometric evaluation.

Manufacturing at Central Office; Scanning and Dispensing at Satellite Office

Figure 3:
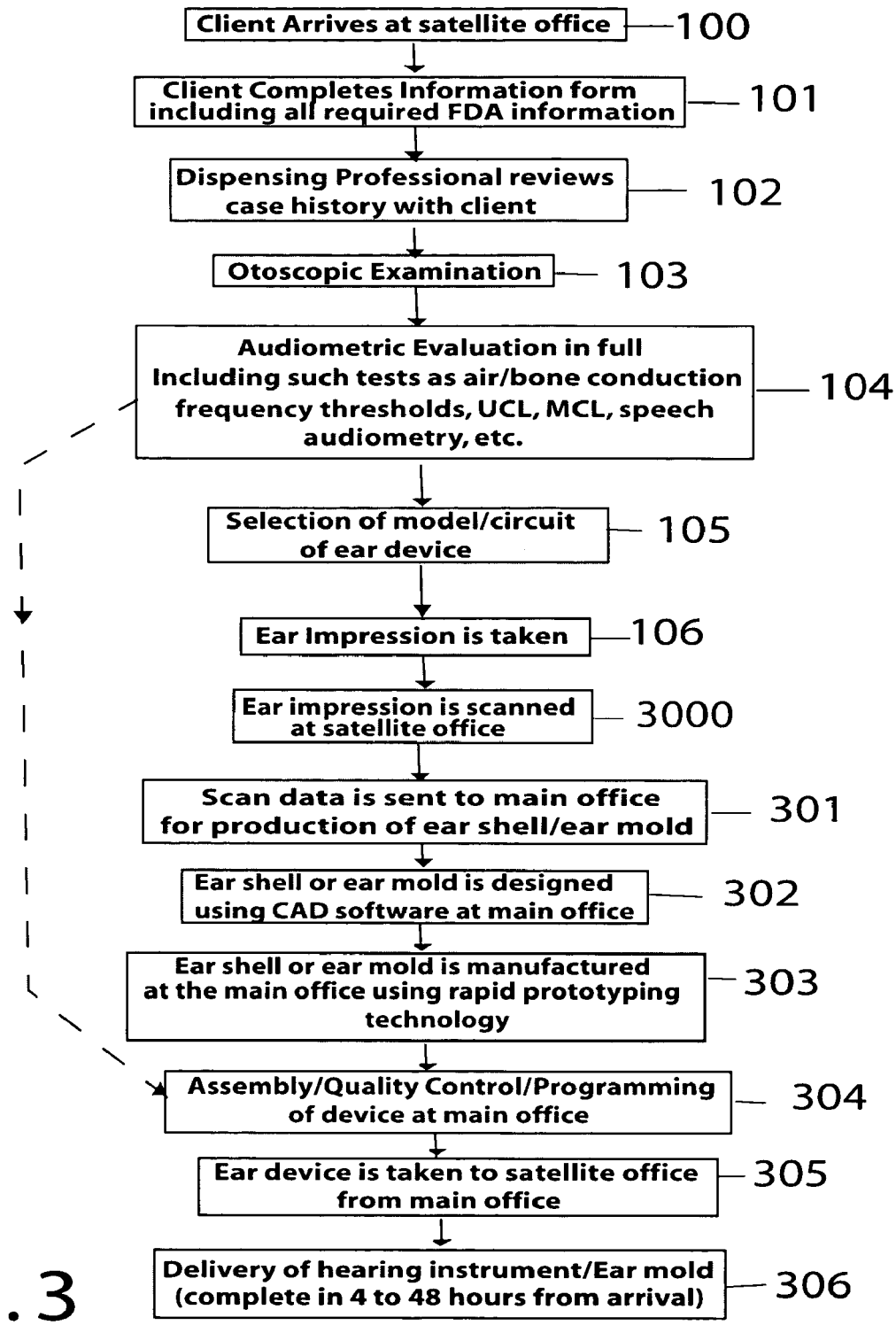
FIG. 3 is a block diagram that illustrates steps of a second method of producing hearing aids and other ear devices for a client arriving at a satellite office in a city according to the invention where an ear impression is scanned at the satellite retail location and an ear shell or ear mold is manufactured by rapid prototyping at a central office in the main office in the city and then returned to the satellite office all in less than forty-eight hours from the time that the client originally arrived at the satellite office.

FIG. 3 illustrates a process where a client is serviced at a satellite office, but an ear shell or ear mold is designed and manufactured using rapid prototyping technology at a central location in the same city or metropolitan region of which the satellite office is in. In other words, the satellite office is separated by only a short car or truck ride (less than two hours) from each other. The client arrives at the satellite office as indicated by processing step 100. The steps of 101–106 are all substantially the same as in FIG. 1, but after an ear impression is taken, the ear impression is scanned at the satellite office as indicated in process block 3000. Next, the scan data is transferred to the main (i.e., central) office in a city or region. Service block 301 illustrates this step. Transfer can occur physically by sending a CD or floppy disk or the like with the scan data recorded thereon. Alternatively, the scan data can be sent electronically via the internet or as a file attached to an e-mail, etc. At the main office, the ear shell or mold is designed using CAD software as shown in process step 302. From the CAD mathematical model of the ear shell or ear mold, the physical ear shell or mold is made at the main office using a rapid prototyping machine. Such step is indicated in process step 303. After assembling and quality control, the electrical circuits for correcting the client's audiometric response are programmed (see process block 304) at the main office with information obtained from the audiometric evaluation of step 104. The physical ear device is now transferred (see service block 305) to the satellite office from the main office. The time from client arrival to delivery of the hearing instrument/ear mold (step 306) varies from a maximum time of forty eight hours to a minimum time of four hours. The time variation is a function of transit time from main office to satellite office and the vagaries of scheduling multiple instrument/ear molds at a central office.

Manufacturing at Nearby Production Facility

Figure 4:
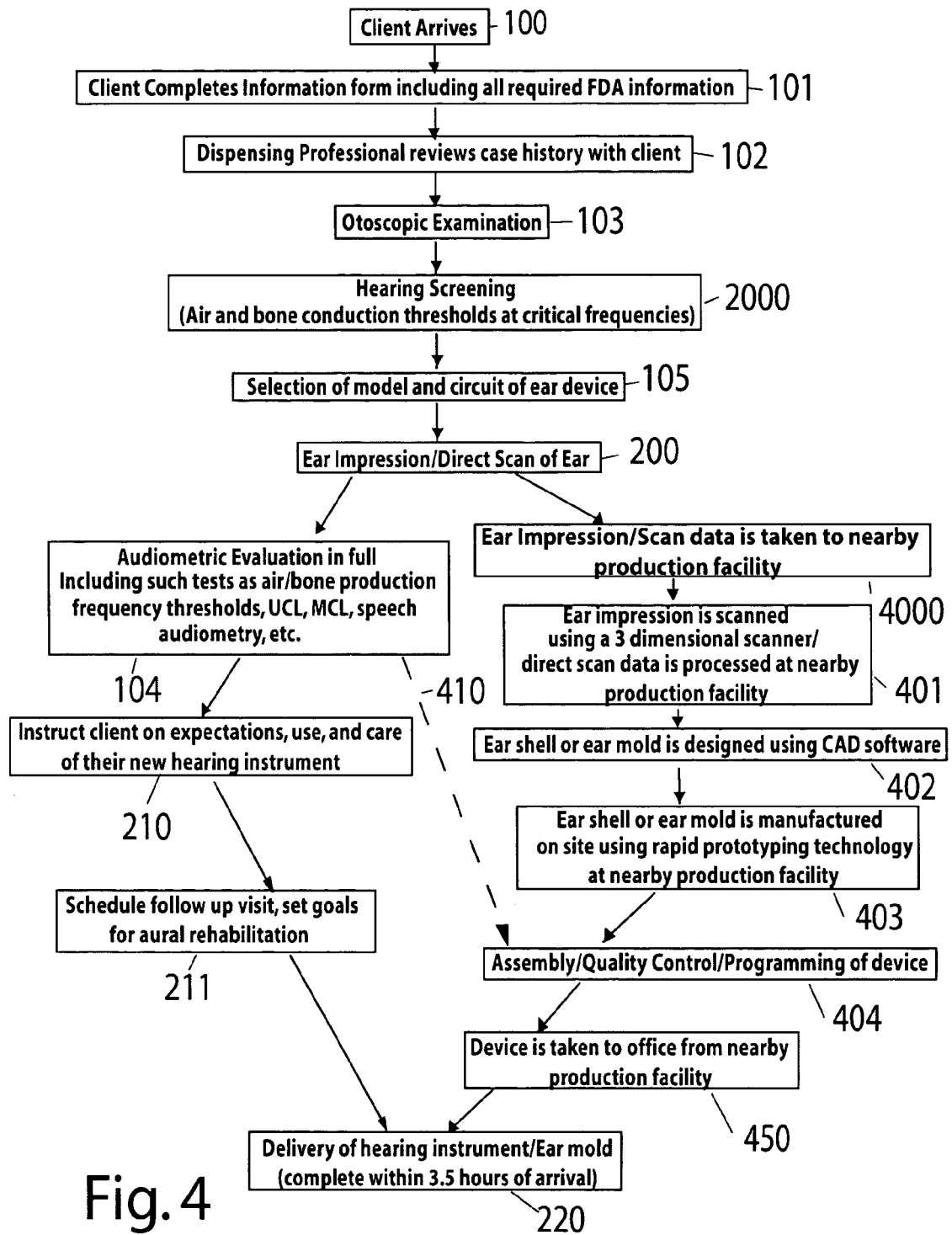
FIG. 4 is a block diagram of the steps of a method similar to that illustrated in FIG. 2 except that the ear impression/scan data is taken to a nearby production facility where it is used to design an ear shell or ear mold with CAD software and the ear shell or ear mold is made.

The process steps for an alternative method of providing a hearing aid device to a client is illustrated in FIG. 4. The process is substantially the same as that illustrated in FIG. 2, except that an ear impression and/or scan data of the ear are transferred to a nearby production facility as indicated in process block 4000. A nearby production facility is a building separate from the dispensing location, but one that can be reached quickly by walking, motorcycle, scooter or car or the like. In other words, a nearby facility can be physically reached in a few minutes. The steps 401, 402, 403 and 404 are all substantially the same as steps 201, 202, 203 and 204 described by reference to FIG. 2. The 401, 402, 403 and 404 steps are all performed at the nearby production facility rather than at the dispensing office as with the 201, 202, 203, and 204 steps. While the manufacturing steps 4000, 401 to 403 are being conducted, the complete audiometric evaluation of step 104 is conducted to produce an amplitude versus frequency response representative of the patient's hearing. Such information is transmitted to the production facility to produce an electronic modular for placement in the ear piece shell. Such step is indicated by arrow 410. The device is taken to the dispensing office from the nearby production facility and like in FIG. 2 (where steps 104, 201 and 211 are performed while steps 400–404 are being performed), the delivery of the hearing instrument/ear mold to the client is accomplished within 3.5 hours of arrival.

Methods of Repairing Existing Ear Aid Devices

If a client simply needs a new electronic module for placement in his ear piece shell, then a new electronic module is produced at the ear dispensing location and plugged into the existing shell all within the time period of a few hours. If the patient needs replacement of his existing ear piece shell, he can have a new one produced within three and one-half hours according to the methods described in FIGS. 2 and 4 and use the existing electronic module to plug into the new shell so that the client is provided with a hearing aid device in a matter of hours rather than a matter of days. Using the method of FIG. 3, a new ear piece shell to replace a broken shell can be produced within a shorter period of time as compared with prior art methods.

While the preferred embodiment of the invention has been illustrated in detail, it is apparent that modifications and adaptations of the preferred embodiment will occur to professionals and business officials in the hearing aid industry. Such modifications and adaptations are in the spirit and scope of the invention as set forth in the following claims:

What is claimed is:

1. A method of dispensing ear pieces comprising the steps of,
    collecting information from a patient upon arrival at an ear piece dispensing location;
    determining a mathematical model of a shape of a portion of said patient's ear at said ear piece dispensing location;
    producing an ear piece shell having an outer shape representative of said portion of said patient's ear using a machine controlled by said mathematical model at said location;
    delivering said ear piece shell to said patient at said ear piece dispensing location within forty-eight hours after arrival of said patient at said dispensing location.

2. The method of claim 1 wherein
    said portion of said patient's ear is an ear canal of said patient.

3. The method of claim 1 wherein
    said step of delivering said ear piece shell to said patient at said ear piece dispensing location occur within three and one-half hours after arrival of said patient at said dispensing location.

4. The method of claim 1 wherein
    said machine in a rapid prototyping machine.

5. The method of claim 1 wherein
    said step of determining a mathematical model of a patient's ear canal includes the steps of,
    creating a physical model of said ear canal, and
    scanning said physical model to determine said mathematical model of said patient's ear canal.

6. The method of claim 1 wherein
    said step of determining a mathematical model of a patient's ear includes the step of,
    direct scanning of said patient's ear to determine said mathematical model of said patient's ear canal.

7. The method of claim 1 further comprising the step of,
    inserting an electronic module within said ear piece shell prior to placing said ear piece in said patient's ear.

8. A method for dispensing ear pieces comprising the steps of,
    collecting information from a patient upon arrival at an ear piece dispensing location;

determining a mathematical model of said an ear canal of said patient at said ear dispensing location;

producing an ear piece shell having an outer shape representative of said ear canal using a machine controlled by said mathematical model, wherein said machine is at a different location from said ear piece dispensing location;

delivering said ear piece shell to said patient within forty-eight hours from said arrival of said patient.

9. The method of claim 8 wherein,
said machine is a rapid prototyping machine.

10. The method of claim 8 wherein,
said mathematical model of said patient's ear canal is determined by creating a physical model of said ear canal and scanning said physical model of said patient's ear canal.

11. The method of claim 8 wherein,
said mathematical model of said patient's ear canal is determined by direct scanning of said patient's ear canal.

12. The method of claim 8 further comprising the step of,
inserting or attaching an electronic module with said ear piece shell prior to delivering said ear piece to said patient.

13. The method of claim 8 wherein,
said delivery step for delivering said ear piece shell to said patient occurs within three and one-half hours from said arrival of said patient.

14. A method for dispensing ear pieces comprising the steps of,
collecting information from a patient upon arrival at an ear piece dispensing location;
obtaining an ear impression of an ear canal of said patient;
delivering said ear impression to a separate manufacturing location that is in the same city or metropolitan region as in said ear-piece dispensing location;
scanning said ear impression to produce a scanned information file representative of said ear canal;
creating an ear piece design from said scanned information file at said manufacturing location;
manufacturing said ear piece using said ear piece design with a rapid prototyping machine; and
delivering said ear piece to said dispensing location within three and one-half hours from said arrival of said patient.

15. A method for dispensing ear pieces comprising,
first, determining a mathematical model of a patient's ear canal at an ear piece dispensing location;
next, producing an ear piece shell having an outer shape representative of said ear canal using a rapid prototyping machine controlled by said mathematical model at said location;
while said ear piece shell is being produced, conducting a hearing test of said patient's ear canal to produce an amplitude versus frequency response representative of said patient's hearing;
producing an electronic module that improves said patient's amplitude versus frequency hearing response;
inserting or attaching said electronic module with said ear piece shell;
placing said ear piece shell with said electronic module inserted therein in said patient's ear within three and one-half hours from the step of determining said mathematical model of said patient's ear canal.

16. A method of dispensing ear pieces comprising,
first, determining a mathematical model of said patient's ear canal at an ear piece dispensing location;
next, producing an ear piece shell having an outer shape representative of said ear canal using a machine controlled by said mathematical model;
while said ear piece shell is being produced, conducting a hearing test of said patient's ear canal to produce an amplitude versus frequency response representative of said patient's hearing;
producing an electronic module that improves said patient's amplitude versus frequency hearing response;
inserting said electronic module within said ear piece;
placing said ear piece with said electronic module inserted therein in said patient's ear within forty-eight hours from the step of determining said mathematical model of said patient's ear canal.

17. The method of claim 16 wherein,
said ear piece shell is produced by said machine which is located at said ear dispensing location.

18. The method of claim 16 wherein,
said ear piece shell produced by said machine which is located at a different building from said ear dispensing location.

19. The method of claim 16 wherein,
said ear piece shell is produced by said machine which is located in the same city or metropolitan region as said ear dispensing location.

20. The method of claim 16 wherein,
said machine is a rapid prototyping machine.

21. A method for dispensing ear pieces comprising the steps of,
collecting information from a patient upon arrival at an ear piece dispensing location;
scanning an ear canal of said patient at said dispensing location to create a scanned data file;
transferring said scanned data file to a separate manufacturing location that is in the same city or metropolitan region as in said ear piece dispensing location;
creating an ear piece design from said scanned information file at said manufacturing location;
manufacturing said ear piece using said ear piece design with a rapid prototype machine at said manufacturing location; and
delivering said ear piece to said dispensing location within three and one-half hours from said arrival of said patient.

* * * * *